United States Patent [19]

Anhalt

[11] Patent Number: 4,501,461

[45] Date of Patent: Feb. 26, 1985

[54] ZERO INSERTION FORCE SOCKET

[75] Inventor: John W. Anhalt, Orange, Calif.

[73] Assignee: International Telephone and Telegraph Corporation, New York, N.Y.

[21] Appl. No.: 565,560

[22] Filed: Dec. 27, 1983

[51] Int. Cl.³ .......................................... H01R 13/629
[52] U.S. Cl. ............................... 339/75 M; 339/143 R
[58] Field of Search ............ 339/74 R, 75 M, 176 M, 339/143 R

[56] References Cited

U.S. PATENT DOCUMENTS

| Re. 28,171 | 9/1974 | Anhalt | 339/75 M |
|---|---|---|---|
| 2,939,100 | 5/1960 | Watts | 339/18 |
| 3,027,534 | 3/1962 | Deakin | 339/18 |
| 3,406,369 | 10/1968 | Taylor | 339/18 |
| 3,418,621 | 12/1968 | Campbell | 339/18 |
| 3,594,698 | 7/1971 | Anhalt | 339/75 M |
| 3,611,251 | 10/1971 | Downhill | 339/18 |
| 3,763,459 | 10/1973 | Millis | 339/75 M |
| 4,012,099 | 3/1977 | Worcester | 339/143 R |
| 4,331,371 | 5/1982 | Ichimura et al. | 339/74 R |
| 4,381,130 | 4/1983 | Sprenkle | 339/74 R |
| 4,397,512 | 8/1983 | Barraire et al. | 339/75 |
| 4,422,703 | 12/1983 | Christensen et al. | 339/74 R |
| 4,468,072 | 8/1984 | Sadigh-Behzadi | 339/74 R |

FOREIGN PATENT DOCUMENTS 872171  7/1961  United Kingdom ............ 339/75 M

OTHER PUBLICATIONS

IBM Technical Disclosure Bulletin, vol. 13, No. 5, Oct./1970, "Insertion/Extraction Test Socket"; Bruder.

Primary Examiner—John McQuade
Attorney, Agent, or Firm—T. L. Peterson

[57] ABSTRACT

A zero insertion force socket for connecting the leads of an integrated circuit carrier to conductors on a printed circuit board. The socket contains a movable actuator which shifts the contacts in the socket into engagement with the leads on the carrier after the leads have been initially inserted into the socket in positions spaced from the contacts. The actuator comprises a partitioning structure made of interleaved thin metal strips which allow a very dense arrangement of the contacts in the socket and also perform an electrical shielding function.

18 Claims, 9 Drawing Figures

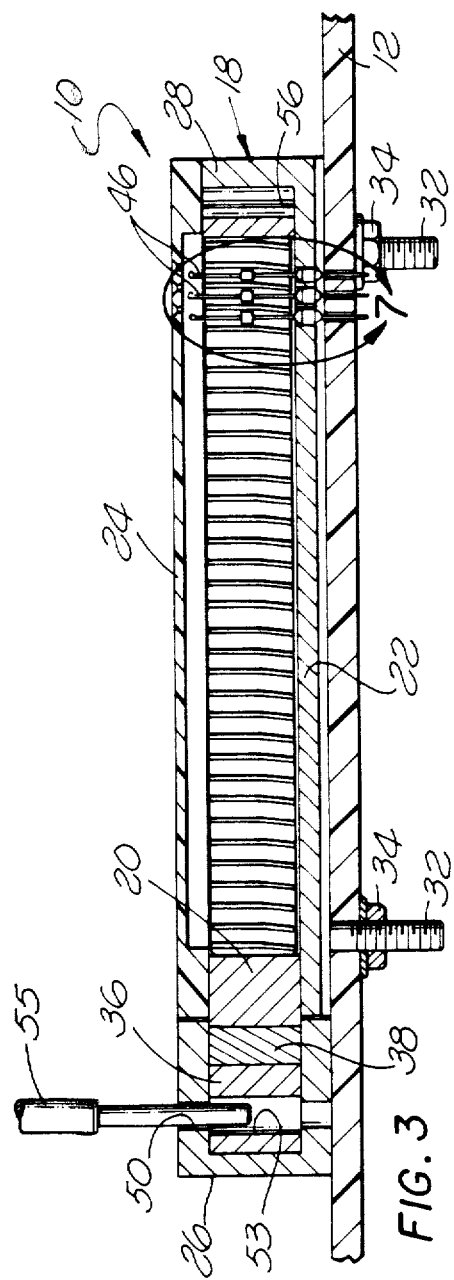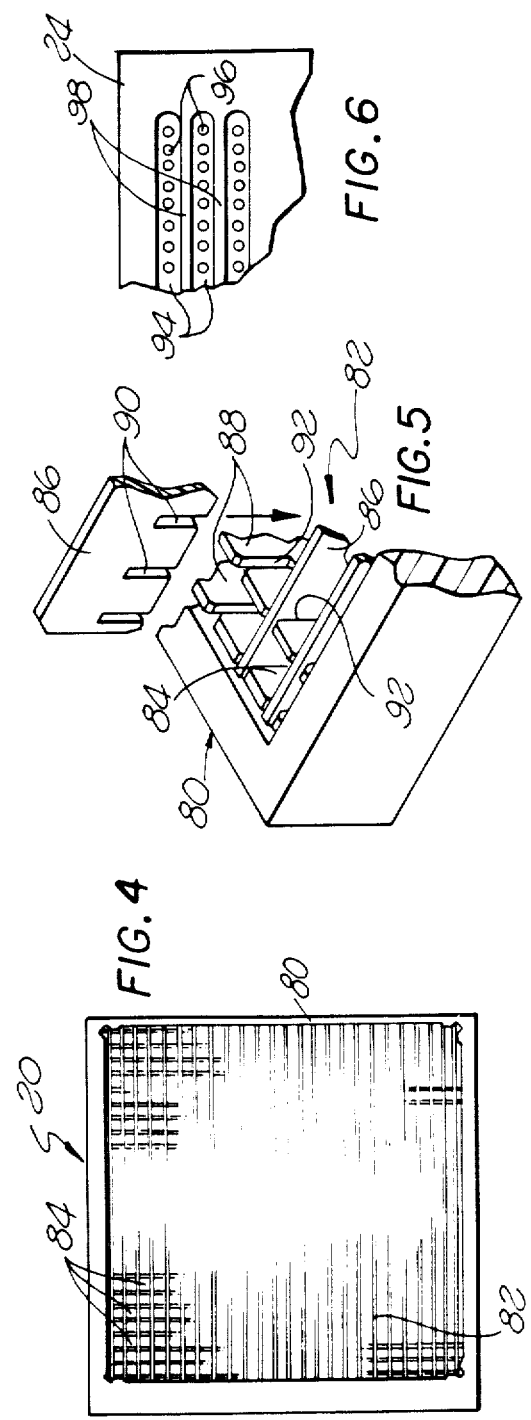

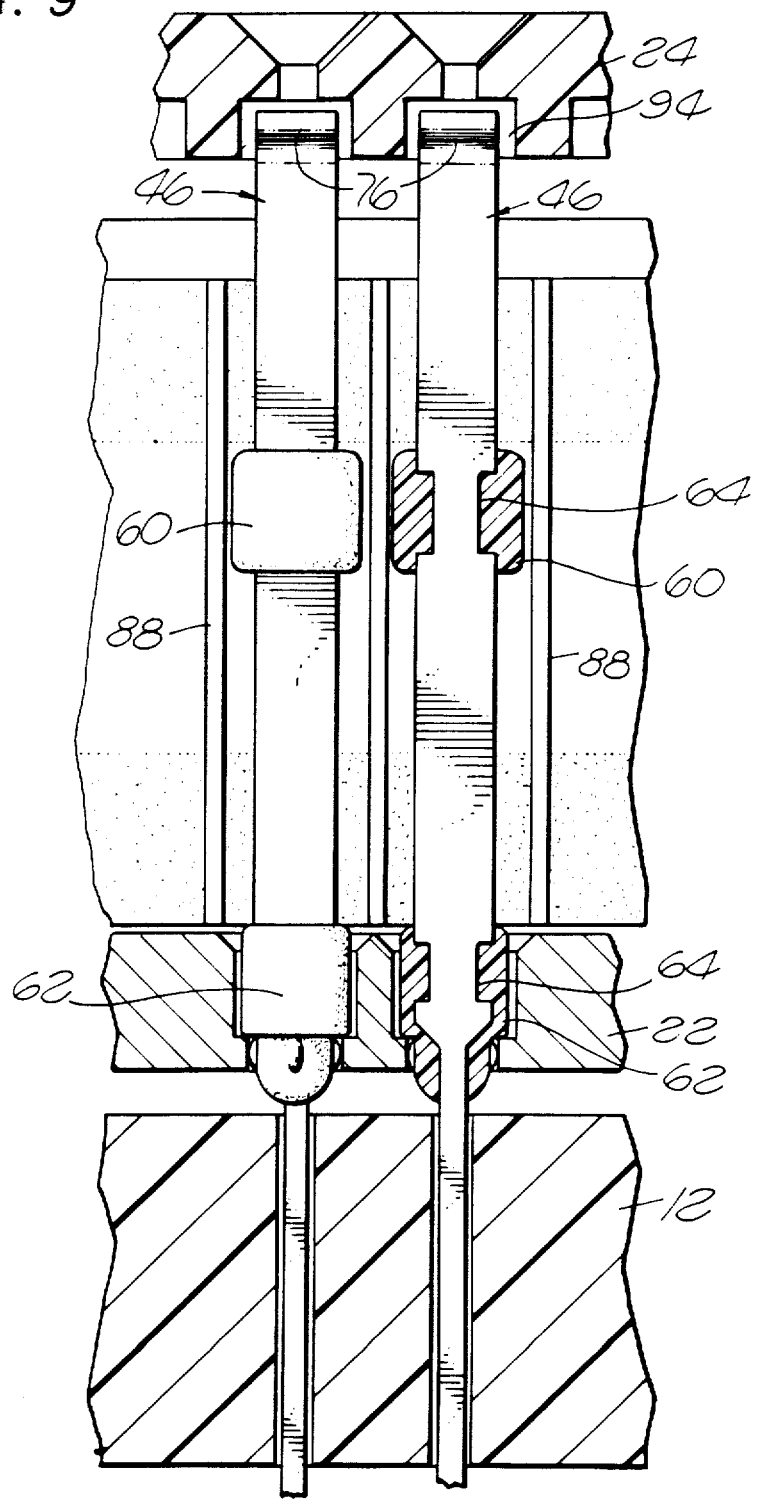

ZERO INSERTION FORCE SOCKET

BACKGROUND OF THE INVENTION

The present invention relates generally to an electrical connector member and, more specifically, to a zero insertion force socket or connector for integrated circuits.

U.S. Pat. No. Re. 28,171 to Anhalt discloses a zero insertion force electrical connector in which, when the plug and receptacle connector members are initially mated, the contacts therein are spaced from each other. An actuating plate is shifted to move the movable contacts in the plug connector member in tandem in a direction to engage the fixed contacts in the receptacle connector member. U.S. Pat. No. 4,397,512 to Barraire et al. discloses a zero insertion force connector or socket for an integrated circuit of the type having rows two of leads on the opposite sides of the carrier. The leads are inserted into the socket with zero insertion force, and an actuating plate is shifted laterally to bring the contacts of the socket into engagement with the leads, similar to the arrangement disclosed in the aforementioned Anhalt patent. In each of the aforementioned prior art connector and socket the actuator plate is formed of nonconductive material and therefore provides no electrical shielding function.

Recently very large scale integrated circuits have become available which are mounted in carriers having a high number of pins or leads extending downwardly therefrom in a rectangular array, with the pins located within an extremely dense matrix, for example, with pin spacing being about 0.070". In one such carrier, there are 1,089 leads arranged in 33 rows to provide a square matrix. Thus, the matrix of leads is 2.240" long on each side. With such a large number of leads, it will be appreciated that the leads must be inserted into a socket with zero insertion force to avoid the risk of damage to the leads, and to the integrated circuit within the carrier. Also it is desirable to provide electrical shielding for the leads to prevent signal loss and/or signal distortion. This requires that the walls separating the contacts in the socket be formed of conductive material, preferably metal.

Due to the very high density contact requirement for a socket to be utilized with the integrated circuit carrier of the type described above, the forming of very small contact cavities in the socket, which are very close to each other, by conventional machining techniques, would be cost prohibitive. Thin wall sections within the socket and small diameter-to-length ratios of the contact cavities would cause extremely low part yield. Casting and molding technology cannot hold the close tolerances necessary to meet the design requirements for high pin count and high pin density integrated circuit sockets.

It is the object of the present invention to provide an integrated circuit socket having conductive walls forming contact cavities having very small cross section, located in a very dense pattern, yet will prevent contact shorting, which is economical to manufacture and will allow connection with the leads of an integrated circuit carrier with zero insertion force.

SUMMARY OF THE INVENTION

According to a principal aspect of the present invention, there is provided a zero insertion force socket for an integrated circuit carrier of the type that is described hereinabove, wherein a contact actuator is mounted for lateral sliding movement on a base plate containing contacts which may be inserted into a printed circuit board, or other electronic packaging device, below the socket. The actuator contains a conductive partitioning structure comprising a first set of parallel spaced metallic strips which are assembled in an interleaved fashion with a second set of parallel spaced metallic strips to thereby form a plurality of rows of rectangular holes or contact cavities. Because the strips may be made extremely thin, such as by stamping, the size of the cavities may be made very small, and the cavities may be arranged in a very dense pattern. The metal partitioning structure provides electrical shielding for the contacts in the socket. Nonconductive hubs are mounted on the socket contacts within the partitioning structure. Normally the contacts are arranged so that when the leads of the integrated circuit carrier are inserted into the socket, the leads will be spaced from the contacts in the socket, thereby allowing insertion of the leads into the socket with essentially zero force. Thereafter, the actuator is shifted laterally causing one set of metal strips of the partitioning structure to engage the nonconductive hubs on the contacts, thereby moving the contacts in tandem into engagement with the leads on the carrier. If desired, the strips forming the walls of the partitioning structure may be coated with a suitable nonconductive material to further assure isolation of the contacts from the electrical shielding structure. It will be appreciated that by forming the metal strips making up the partitioning structure by stamping and by assembling the same in an interleaved fashion as described above, the structure may be made quite inexpensively yet with the size of the cavities thus formed being very small and close to each other. The interleaved strip structure is tightly mounted in a surrounding rectangular frame which provides a self-supporting, relatively rigid assembly which may be utilized as the actuating member in the zero insertion force connector of the present invention. Thus, the present invention provides a relatively low cost socket which may be utilized with integrated circuit carriers having a very large number of leads located in a dense matrix.

BRIEF DESCRIPTION OF THE DRAWINGS

FIG. 3 is a transverse sectional view of the socket taken along line 3—3 of FIG. 2, with the socket being shown mounted on a printed circuit board;

FIG. 4 is a top plan view of the contact actuator utilized in the socket of the present invention, which incorporates a partitioning structure which forms the contact cavities of the actuator;

FIG. 5 is a fragmentary, perspective view showing how the metal strips of the partitioning structure are assembled within the frame of the contact actuator;

FIG. 6 is a fragmentary bottom view showing a portion of the underside of the top plate of the socket;

FIG. 9 is a sectional view taken along line 9—9 of FIG. 7.

DESCRIPTION OF THE PREFERRED EMBODIMENTS

Figure 1:
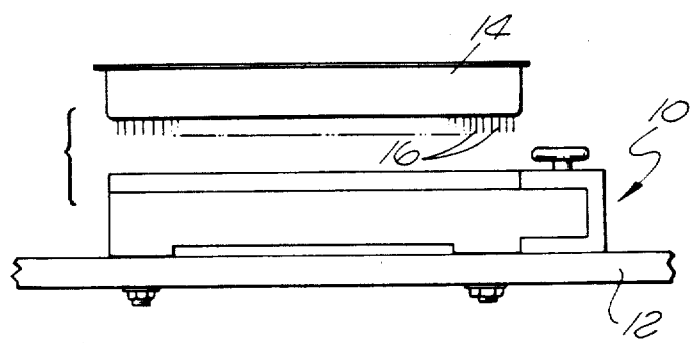
FIG. 1 is a side elevational view of the socket of the present invention mounted on a printed circuit board, with an integrated circuit carrier positioned above the socket for mounting thereon.

Referring now to the drawings in detail, there is illustrated in FIG. 1 the socket of the present invention, generally designated 10, which is mounted on a printed circuit board 12. An integrated circuit carrier 14 is positioned above the socket 10 with its leads 16 positioned for insertion into the socket. The leads are arranged in a square matrix, although they could be arranged in other patterns.

The socket 10 comprises a housing 18 which contains a contact actuator 20 that is slidable within the housing between unactuated and actuated positions. The housing includes a base plate 22 formed of a suitable metal, such as aluminum, a nonconductive top plate 24 and a channel member 26 at one end of the plates and attached thereto by suitable fastener means, not shown. The base plate 22 has three sidewalls 28, only one being seen in FIG. 3, which support the top plate 24. The top plate is secured to the sidewalls of the base plate by fasteners 30. Threaded pins 32 extend downwardly from the base plate through openings in the printed circuit board. Nuts 34 are threaded onto the pins to secure the socket onto the board.

A cam member 36 is reciprocally mounted within the channel member 26 of the socket housing. A cam bearing 38 is positioned within the channel member 26 between the cam member and the contact actuator 20 of the socket. As seen in FIG. 3, the cam member 36 has a generally square cross section while the cam bearing 38 has a rectangular cross section. Two or more lobes 40 are formed on the cam bearing 38 facing the cam member 36, only one such lobe being visible in FIG. 2. Elongated recesses 42 are formed in the side of the cam member 36 corresponding to each of the lobes 40. Each recess 42 provides an inclined cam surface 44 which engages a corresponding lobe 40. It will be appreciated that if the cam member 36 is shifted downwardly as viewed in FIG. 2, the cam surface 44 will bear against the curved surface of the lobe 40 causing the bearing 38 to shift in the rightward direction thereby moving the contact actuator 20 in the direction toward the end wall 28 of the housing opposite to the channel member 26. The shifting of the contact actuator 20 in this direction will cause the contacts 46 of the socket to come into engagement with the leads 16 on the integrated circuit carrier 14 in a manner which will be described in greater detail later.

Two slots 50 and 51 are formed in the channel member 26 above the cam member 36. A rigid web 52 separates the slots. Openings 53 and 54 are formed in the cam member aligned with the slots 50 and 51 and located generally on opposite sides of the web 52. The cam member 36 may be shifted downwardly to actuate the contacts by inserting a suitable tool 55 through the slot 50 into the opening 53 in the cam member. The tool is pivoted about the web 52 to shift the cam member downwardly. By inserting the tool through slot 51 into opening 54 and pivoting the tool in the opposite direction the cam member may be shifted upwardly to the position shown in FIG. 2. Leaf springs 56 are mounted in the opposite side of the socket housing between the end wall 28 and the actuator 20 to return the actuator to its unactuated position to disengage the contacts 46 from the leads of the integrated circuit carrier after the cam member 36 has shifted to the position illustrated in FIG. 2 by manipulation of the tool 55.

Figure 7:
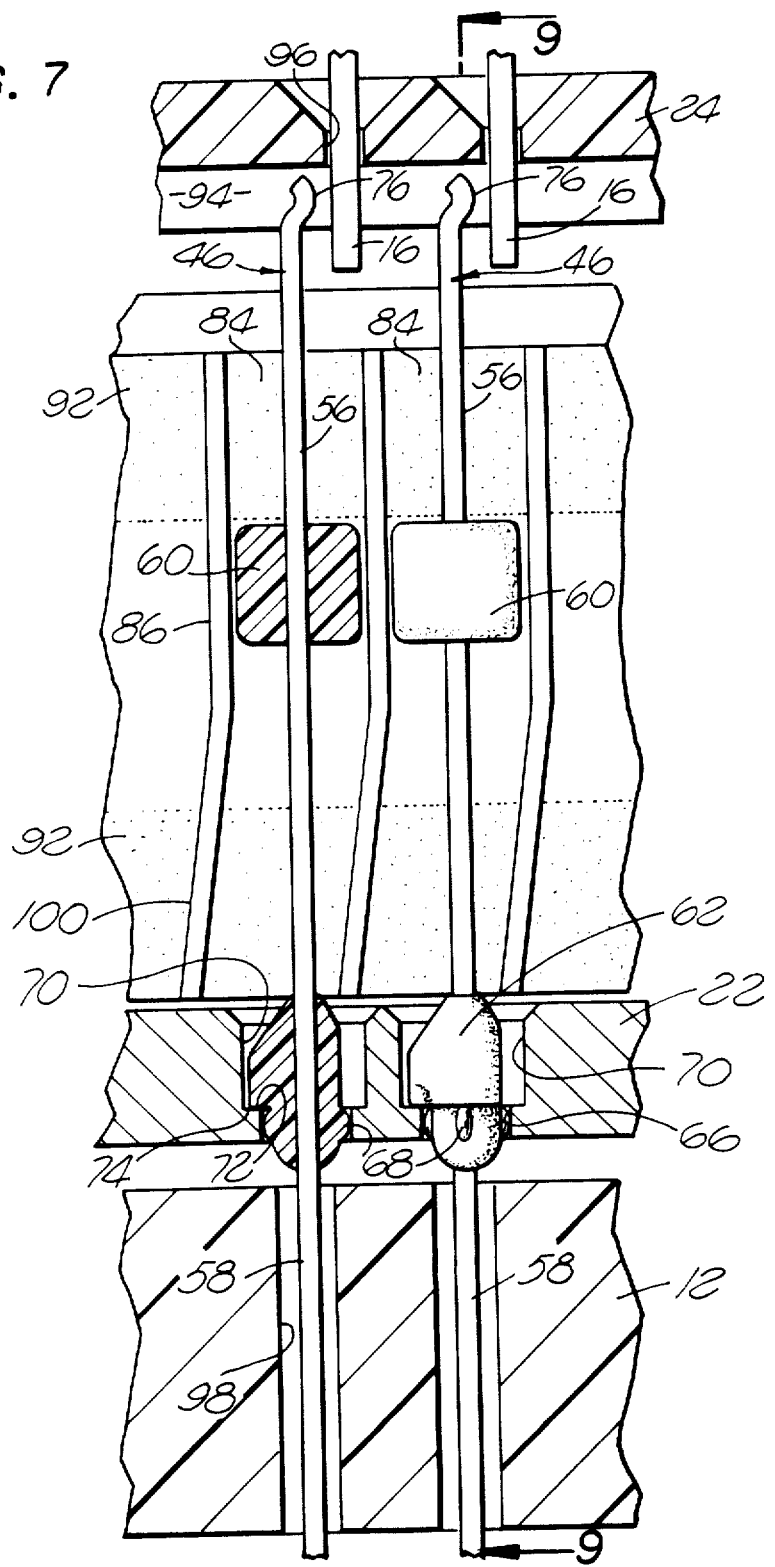
FIG. 7 is an enlarged view of the portion of FIG. 3 encircled by the line 7—7 illustrating more clearly the contacts utilized in the socket of the invention, with the leads of the integrated circuit component being shown inserted through the apertures in the top plate of the socket, and the contacts in the socket shown in their unactuated condition.
Figure 8:
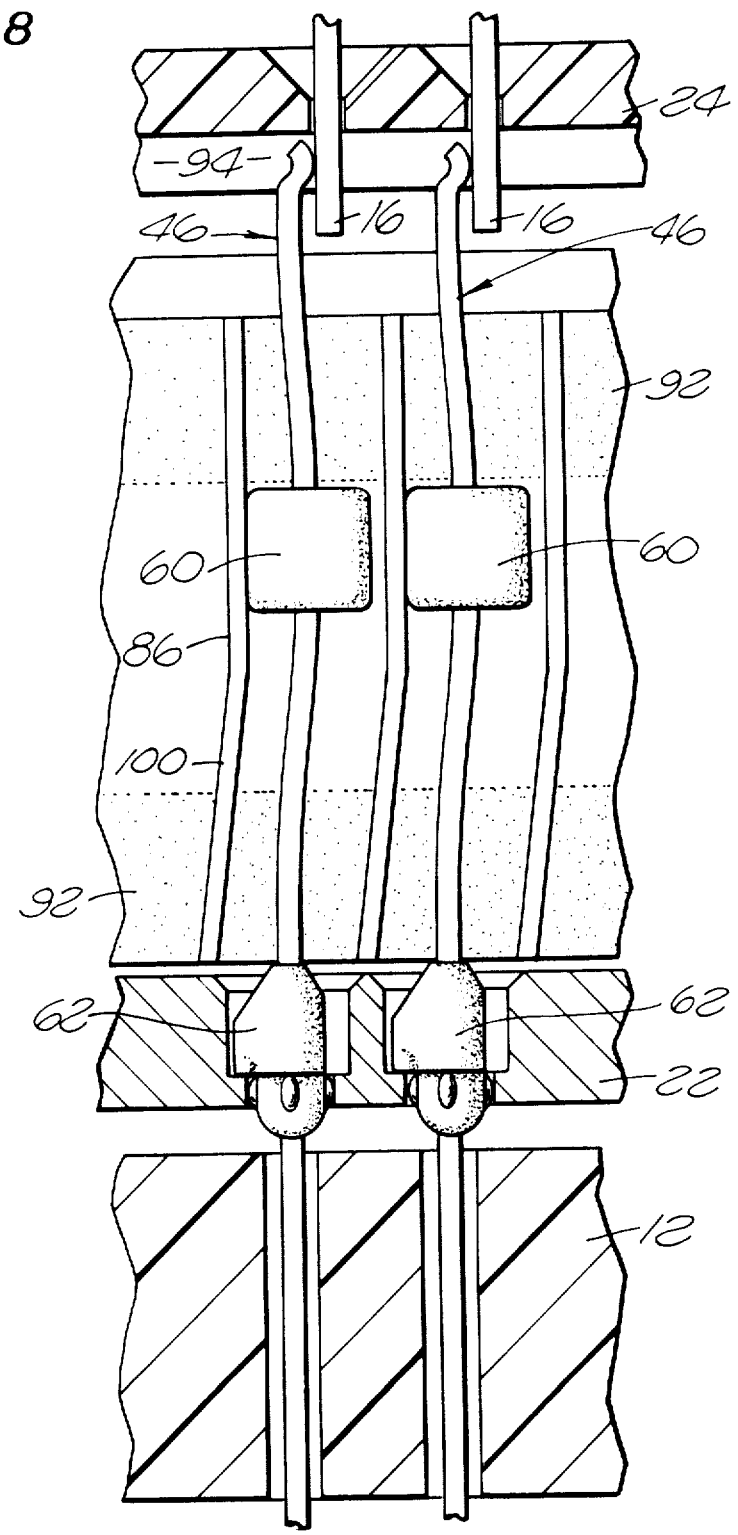
FIG. 8 is an enlarged view similar to FIG. 7 showing the contact actuator shifted in the rightward direction to bring the contacts of the socket into engagement with the leads of the integrated circuit carrier.

As best seen in FIGS. 7 to 9, each contact 46 has an upper relatively flat resilient blade 56 and a lower terminal section 58. Plastic hubs 60 and 62 are mounted on the intermediate and lower portions respectively of the blade 56 of each contact. As seen in FIG. 9, notches 64 are formed in the opposite sides of the blade 56 of each contact. The hubs 60 and 62 may be molded around the blade in the regions of the notches to provide a secure attachment of the hubs to the contact. The lower hub 62 of each contact is mounted within an aperture 66 in the base plate 22 of the socket housing. Preferably rounded projections 68 are formed on the sides of the hubs 62 which have an interference fit with the wall of the aperture to firmly retain the contact therein. Each aperture 66 is counterbored as indicated at 70 to provide an upwardly facing annular shoulder 72. A downwardly facing shoulder 74 formed on the lower hub 62 engages the shoulder 72 thereby restricting downward movement of the contact in the housing, and precisely positioning the contact vertically within the housing. The upper end of each contact blade 56 is bent, as seen in FIG. 7, to provide a curved contacting region 76 which faces in the direction of the leads of the integrated circuit carrier when the latter are inserted into the socket.

The contact actuator 20 comprises a rectangular frame 80 in which there is mounted a partitioning structure 82 that forms the contact cavities 84 of the actuator. The partitioning structure 82 is made up of two sets of thin metal strips 86 and 88. The strips 86 are parallel to each other as are the strips 88, and the two sets of strips are perpendicular to each other. Vertical slots 90 are formed in the strips 86 which open at the lower edges of the strips. Vertical slots 92 are formed in the strips 88 which open at the upper edges of the strips. The two sets of strips 86 and 88 are assembled in an interleaved fashion similar to the ice trays utilized in years past. The strips 86 and 88 may be formed of a very thin gauge metal, such as aluminum or cooper. Since the metal strips are very thin, the partitioning structure 82 formed thereby does not have as great a structural rigidity as desired for a contact actuator which must be shifted within a housing. Accordingly, the partitioning structure 82 is fit within the frame 80 with a slight interference engagement which enhances the structural rigidity of the partitioning structure. The slotted strips 86 and 88 may be inexpensively manufactured by a conventional stamping operation. By the use of a stamping operation, precise dimensional control can be maintained at a reasonable cost.

It is preferred that the metal strips 86 and 88 making up the partitioning structure and the frame 80 be solder plated before the partitioning structure is mounted in the frame. Once assembled, the solder is reflowed to provide additional structural support to the partitioning structure within the actuator. Thereafter, the assembly may be coated with a dielectric coating to prevent electrical engagement from occurring between the contacts 46 and the walls of the partitioning structure if for some reason the plastic hubs 60 on the contacts do not prevent such engagement during actuation of the contacts. The necessary dielectric coating may be achieved by spraying the opposite sides of the actuator 20 with a suitable plastic, such as TFE epoxy base plastic, and the coated structure may then be baked to cure the plastic. Because of the extremely small size of the contact cavities 84 formed in the partitioning structure, it may be possible only to coat the upper and lower portions of the strips 86 and 88 of the structure with the plastic material, as indicated at 92 in FIG. 7.

It will, of course, be appreciated that the number and pattern of contact receiving apertures 66 in the base plate 22 of the socket, and the number and pattern of the contact cavities 84 formed by the partitioning structure 82 of the contact actuator 20, correspond to the number and pattern of the leads 16 on the integrated circuit carrier. The contact cavities 84 in the actuator 20 are generally aligned with the apertures 66 in the base plate 22, and the flat blades 56 of the contacts extend upwardly through the cavities 84 above the partitioning structure. The upper ends of the blades extend into elongated grooves 94 formed in the bottom of the top plate 24 of the socket housing. Apertures 96 are formed in the top plate 24 which are arranged in a pattern for receiving the leads 16 of the carrier 14. As best seen in FIG. 7, the apertures 96 are generally aligned with the contact cavities 84 in the contact actuator, but are offset slightly with respect to the center axes of the cavities so that when the leads 16 of the integrated circuit carrier are inserted through the apertures 96, the leads will be disposed on the side of the contacts 46 opposite to the cam member 36 at the left side of the socket housing as viewed in FIG. 2. That is, the apertures 96 are disposed on the right side of the contacts 46. The grooves 94 formed in the bottom of the top plate 24 extend lengthwise of the rows of apertures 96 extending between the channel member 26 and the opposing end wall 28 of the housing. The grooves are separated from each other to provide therebetween vertical walls 98 which electrically isolate the respective rows of contacts and carrier leads.

In order to assemble the socket of the present invention, initially the top plate 24 and contact actuator 20 are removed so that the contacts 46 may be mounted in the apertures 66 in the base plate. The contacts are pushed downwardly so that the rounded projections 68 on the lower hubs 62 will make an interference fit with the walls of the apertures to securely retain the contacts therein. Thereafter, the contact actuator is mounted downwardly over the assembly of contacts, and then the top plate 24 is mounted on the top of the side walls of the base plate and secured thereto by suitable fastening means. The socket may then be mounted on a printed circuit board and fixed thereto by the nuts 34 assembled to the threaded pins 32. When the socket is mounted on the printed circuit board, the terminal portions 58 of the contacts will extend into aligned openings 98 in the board which may be plated through. The terminal portions of the contacts may be soldered or have a press fit with the plated holes to provide electrical connections between the contacts and conductive traces on the board.

Figure 2:
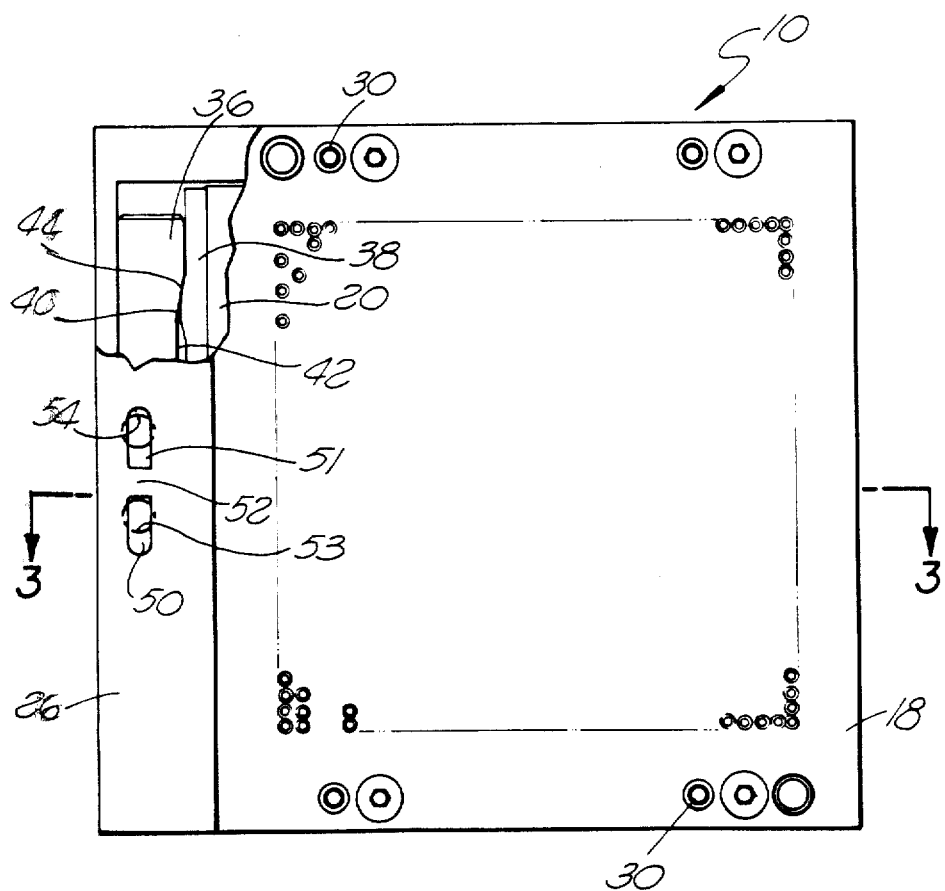
FIG. 2 is a top plan view of the socket of the present invention.

When the cam member 36 of the socket is in the position illustrated in FIGS. 2 and 3, the upper blade portions 56 of the contacts are positioned to the left side of the apertures 96 in the top plate of the socket as seen in FIG. 7. Therefore, the contacts 46 are positioned out of alignment with the apertures 96 in the top plate.

Thus, the integrated circuit carrier 14 may be mounted on top of the socket with the leads 96 inserted downwardly through the apertures 96 in the top plate with zero force. When the cam member 36 is shifted downwardly from the position illustrated in FIG. 2 by use of the tool 55, the cam bearing 38 shifts in the rightward direction in the manner described previously herein thereby causing the contact actuator 20 to shift toward the opposite sidewall 28 of the socket housing. This will cause the partitioning structure 82 of the contact actuator to shift from the position illustrated in FIG. 7 to the position illustrated in FIG. 8 whereupon the strips 86 of the structure will push against the hubs 60 on the blades 56 of the contacts, causing the blades to shift in tandem in the rightward direction bringing the curved contacting regions 76 thereof into engagement with the leads 16 on the integrated circuit carrier.

Since the contacts are engaged by the actuator at an intermediate portion due to the hubs 60 thereon, the upper ends of the contacts will engage the leads of the carrier with a wiping action thereby providing an effective electrical connection between the contacts and the leads. In order to assure that no engagement occurs between the walls of the contact actuator and the contacts, it is preferred that the lower portions 100 of the strips 86 of the partitioning structure be bent rearwardly in the direction of the cam member 36. This will allow a greater thrust to be applied to the contact actuator by the cam member 36 to achieve a higher contact engagement between the contacts and the leads of the integrated circuit carrier without risk of the walls of the partitioning structure engaging the contacts. Since the partitioning structure is mounted in the frame 80 of the contact actuator with an interference fit, there is an electrical interconnection between all the plates and the frame. The frame in turn is electrically engaged with the metallic base plate 22 of the socket housing. This arrangement provides electrical shielding for the contacts to minimize signal loss and/or signal distortion through the socket.

While the base plate 22 and top plate 24 have been shown as being formed of solid material (metal and plastic, respectively) it is also possible to form these plates in a similar fashion to the contact actuator 20 in which case the apertures therethrough would be square, rather than circular. Such an arrangement would provide a higher degree of electrical shielding than the embodiment of the invention illustrated in the drawings. However, with a metal top plate, it would be necessary to completely coat the same with a suitable nonconductive material, such as plastic, to assure that the leads of the integrated circuit carrier will not be electrically connected to each other. Other variations and modifications of the invention will be apparent to those skilled in the art.

What is claimed is:

1. A socket for an integrated circuit carrier having a plurality of rows of conductive leads depending therefrom comprising:
   a base plate and a top plate having a separate conductive partitioning structure therebetween slidable along a predetermined path relative to said base and top plates from a first position adjacent to one side of said plates to a second position adjacent to the opposite side of said plates;
   said partitioning structure comprising a first set of parallel spaced metallic strips and a second set of parallel spaced metallic strips, said strips of said first set extending perpendicular to said strips of said second set thereby forming a plurality of rows of rectangular holes, said strips of said first and second sets being interleaved with each other and being securely mounted in a surrounding rectangular conductive frame to thereby provide a self-supporting assembly;

said strips of said first set being perpendicular to said predetermined path;

said base plate and said top plate containing apertures aligned with said holes;

contacts mounted in said apertures in said base plate extending upwardly through said holes;

said apertures in said top plate being adapted to receive therein said conductive leads of said circuit carrier with the leads spaced from said contacts on the side thereof opposite to said one side of said plates when said partitioning structure is in said first position whereby said leads may be inserted into the socket with essentially zero force;

a nonconductive element carried by each said contact within said partitioning structure; and means for shifting said partitioning structure laterally along said predetermined path to said second position to cause the strips of said first set to push against said nonconductive elements to thereby bring said contacts into engagement with said leads.

2. A socket as set forth in claim 1 wherein:
one of said plates is conductive.

3. A socket as set forth in claim 1 wherein:
said base plate is conductive and is electrically engaged with said partitioning structure; and
means electrically isolate said contacts from said base plate.

4. A socket as set forth in claim 3 wherein:
said electrical isolating means comprises nonconductive hubs on said contacts firmly engaged within said apertures in said base plate.

5. A socket as set forth in claim 1 wherein:
each said nonconductive element comprises a hub surrounding said contact.

6. A socket as set forth in claim 5 wherein:
said hub is molded on said contact.

7. A socket as set forth in claim 1 wherein:
an insulation coating is provided on said metallic strips of said partitioning structure.

8. A socket as set forth in claim 1 wherein:
a solder coating on said metallic strips is reflowed to provide a rigid, integral assembly.

9. A socket as set forth in claim 8 wherein:
an insulation coating is provided on said metallic strips at least adjacent to their upper and lower edges.

10. A socket as set forth in claim 1 wherein:
the lower portions of said strips of said first set are bent toward said one side of said plates.

11. An electrical connector member comprising:
a base plate having an actuator slidably mounted thereon;
said actuator comprising a partitioning structure formed of a first set of parallel spaced metallic strips and a second set of parallel spaced metallic strips, said strips of said first set extending perpendicular to said strips of said second set thereby providing a plurality of rows of rectangular holes.
said base plate containing apertures aligned with said holes;
contacts mounted in said apertures extending upwardly through said holes;
a nonconductive element carried by each said contact within said partitioning structure; and
means for shifting said actuator laterally relative to said base plate to cause strips of said partitioning structure to push against said nonconductive elements to thereby deflect said contacts in tandem in a predetermined direction.

12. An electrical connector member as set forth in claim 11 wherein:
said actuator includes a rectangular conductive frame surrounding said partitioning structure; and
said strips of said first and second sets are interleaved with each other and are firmly mounted in said frame with the end edges of said strips tightly engaging the sides of said frame to thereby provide a self-supporting assembly.

13. An electrical connector member comprising:
a base plate having an actuator slidably mounted thereon;
said actuator comprising a partitioning structure formed of a first set of parallel spaced metallic strips and a second set of parallel spaced metallic strips, said strips of said first set extending perpendicular to said strips of said second set thereby providing a plurality of rows of rectangular holes;
said actuator including a rectangular conductive frame surrounding said partitioning structure, said strips of said first and second sets being interleaved with each other and firmly mounted in said frame with the end edges of said strips tightly engaging the sides of said frame to thereby provide a self-supporting assembly;
said base plate containing apertures aligned with said holes;
contacts mounted in said apertures extending upwardly through said holes;
individual nonconductive driving means associated with each of said contacts within said partitioning structure; and
means for shifting said partitioning structure laterally relative to said base plate to cause strips of said structure to push said driving means laterally to thereby deflect said contacts in tandem in a predetermined direction.

14. An electrical connector member as set forth in claim 13 wherein:
said base plate is conductive and is electrically engaged with said partitioning structure; and
means electrically isolate said contacts from said base plate.

15. An electrical connector member as set forth in claim 14 wherein:
said electrical isolating means comprises nonconductive hubs on said contacts firmly engaged within said apertures in said base plate.

16. An electrical connector member as set forth in claim 13 wherein:
said driving means comprises a hub surrounding each said contact.

17. An electrical connector member as set forth in claim 13 wherein:
a solder coating on said metallic strips is reflowed to provide a rigid, integral assembly.

18. An electrical connector member as set forth in claim 17 wherein:
an insulation coating is provided on said metallic strips at least adjacent to their upper and lower edges.

* * * * *